(12) United States Patent
Matsuki et al.

(10) Patent No.: US 6,930,355 B2
(45) Date of Patent: Aug. 16, 2005

(54) SILICIDED TRENCH GATE POWER MOSFETS ULTRASONICALLY BONDED TO A SURFACE SOURCE ELECTRODE

(75) Inventors: Hirobumi Matsuki, Yokohama (JP); Akio Takano, Kawasaki (JP); Takahiro Kawano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/438,814

(22) Filed: May 16, 2003

(65) Prior Publication Data

US 2004/0026753 A1 Feb. 12, 2004

(30) Foreign Application Priority Data

May 16, 2002 (JP) ........................................ 2002-141495

(51) Int. Cl.[7] ............................. H01L 23/48; H05K 1/18
(52) U.S. Cl. ...................... 257/341; 257/690; 257/692; 257/698; 257/771
(58) Field of Search .................. 257/341, 689, 257/690, 692, 698, 707, 735, 755, 757, 758, 771, 782, E21.481, E23.052, E23.124

(56) References Cited

U.S. PATENT DOCUMENTS 5,539,244 A * 7/1996 Mori et al. ................. 257/784
5,703,399 A * 12/1997 Majumdar et al. .......... 257/723
6,307,755 B1 * 10/2001 Williams et al. ............ 361/813

FOREIGN PATENT DOCUMENTS

JP          2000-114445        4/2000
JP          2002-76195         3/2002

OTHER PUBLICATIONS

U.S. Appl. No. 10/289,339, filed Nov. 7, 2002, Takano et al.
U.S. Appl. No. 10/438,814, filed May 16, 2003, Matsuki et al.
U.S. Appl. No. 10/686,587, filed Oct. 17, 2003, Funato et al.

* cited by examiner

Primary Examiner—Minhloan Tran
Assistant Examiner—Thomas L Dickey
(74) Attorney, Agent, or Firm—Oblon, Spivak, McClelland, Maier & Neustadt, P.C.

(57) ABSTRACT

A semiconductor device comprising a semiconductor substrate having first and second surfaces opposing each other, the substrate including a plurality of cells sharing a common drain region, each of the cells having source and gate regions, a surface source electrode connected to the source region of each of the cells and provided on the first surface, a strap member coupled with the surface source electrode by ultrasonic waves, a gate polysilicon wiring layer connecting the gate region of each of the cells and having a silicide layer in at least a portion of a surface thereof, a surface gate electrode connected to the gate polysilicon wiring layer and provided on the first surface, and a drain electrode provided on the second surface and shared by the cells.

12 Claims, 7 Drawing Sheets

SILICIDED TRENCH GATE POWER MOSFETS ULTRASONICALLY BONDED TO A SURFACE SOURCE ELECTRODE

CROSS-REFERENCE TO RELATED APPLICATIONS

This application is based upon and claims the benefit of priority from the prior Japanese Patent Application No. 2002-141495, filed May 16, 2002, the entire contents of which are incorporated herein by reference.

BACKGROUND OF THE INVENTION

1. Field of the Invention

The present invention relates to a semiconductor device and, more particularly, to a semiconductor device in which a surface source electrode of a MOSFET (insulated gate field-effect transistor) is electrically connected to a lead frame via a strap member. For example, the present invention is used in a trench gate type power MOSFET.

2. Description of the Related Art

FIG. 5 is a plan view schematically showing a portion of a conventional trench gate type power MOSFET using a wire bonding structure. FIG. 6 is a sectional view schematically showing a structure taken along a line VI—VI in FIG. 5.

This power MOSFET is comprised of a plurality of MOSFET cells, and includes a surface source electrode (Source-AL) 13 connecting to source diffusion layers 4 and a surface gate electrode (Gate-AL) 14 connecting to a gate polysilicon wiring layer 7a. The MOSFET cells are formed in a semiconductor chip 40 which is mounted on a lead frame (not shown). A plurality of wires (Source-Wire) 41 are connected by bonding so as to electrically connect the surface source electrode 13 to the lead frame. A wire (Gate-Wire) 15 is connected by bonding so as to electrically connect the surface gate electrode 14 to a lead portion of the lead frame.

As each of the surface source electrode 13 and surface gate electrode 14, an Al electrode mainly composed of Al is used. A portion of the gate polysilicon wiring layer 7a is formed into a planar stripe in the array of the source diffusion layers 4. To reduce the internal resistance (to be referred to as rg hereinafter) of the gate, a gate Al (Gate-Al) wiring layer 42 mainly composed of Al is formed in contact with the upper surface of the gate polysilicon wiring layer 7a. The gate Al wiring layer 42 and the surface source electrode 13 are two-dimensionally interdigitated.

Recently, it is strongly demanded to reduce the ON resistance of a power MOSFET. As a package for achieving this demand, a strap member structure which connects the surface source electrode by a strap member is attracting attention. A representative example is Jpn. Pat. Appln. KOKAI Publication No. 2000-114445.

The conventional power MOSFET strap member structure connects a Cu strap member to the surface source electrode via an adhesive such as Ag paste.

Unfortunately, in reliability tests such as a temperature cycle test for a power MOSFET, this strap member structure shortens the life of the power MOSFET because the thermal expansion coefficients of an Al electrode on the chip surface, the Ag paste, the Cu strap member, and a Cu lead frame are different.

To solve this problem, a method of connecting a strap member by using ultrasonic waves (to be referred to as US hereinafter) has been proposed.

FIG. 7 is a plan view schematically showing a portion of a conventional power MOSFET using a strap member. FIG. 8 is a sectional view taken along a line VIII—VIII in FIG. 7. In FIGS. 7 and 8, the same reference numerals as in FIGS. 5 and 6 denote the same parts.

The reliability of this power MOSFET strap member is greatly improved by connecting a Cu or Al strap member (Source-Strap) 16 onto a surface source electrode 13 by US.

In this structure, the strap member is connected onto the surface source electrode 13. Therefore, if a gate Al wiring layer 42 exists as in the prior art shown in FIGS. 5 and 6, the gate Al wiring layer 42 is broken and short-circuited to the surface source electrode 13 when the strap member is connected by US near the gate Al wiring layer 42. This often causes a short circuit between a gate G and source S.

Accordingly, the gate Al wiring layer is omitted as shown in FIG. 7, so the gate Al wiring layer 42 and the surface source electrode 13 are not two-dimensionally interdigitated.

The existence, however, of the gate Al wiring layer 42 has a large effect on the internal resistance rg of the gate. If this gate Al wiring layer is omitted as shown in FIG. 7, rg will be increased about twice (approximately 3Ω) as compared with about 1.5Ω when the gate Al wiring layer 42 exists as in the prior art. This rg rise lowers the conversion efficiency when the power MOSFET is used for synchronous rectification. Therefore, this power MOSFET cannot be used for synchronous rectification.

In the conventional power MOSFET as described above, no gate Al wiring layer can be formed when a strap member is connected onto the surface source electrode by US in order to improve the reliability. This will result in the increase of the internal resistance rg of the gate.

BRIEF SUMMARY OF THE INVENTION

According to an aspect of the present invention, a semiconductor device comprises a semiconductor substrate having first and second surfaces opposing each other, the substrate including a plurality of cells sharing a common drain region, each of the cells having source and gate regions; a surface source electrode connected to the source region of each of the cells and provided on the first surface; a strap member coupled with the surface source electrode by ultrasonic waves; a gate polysilicon wiring layer connecting the gate region of each of the cells and having a silicide layer in at least a portion of a surface thereof; a surface gate electrode connected to the gate polysilicon wiring layer and provided on the first surface; and a drain electrode provided on the second surface and shared by the cells.

DETAILED DESCRIPTION OF THE EMBODIMENTS

Embodiments will be described in detail below with reference to the accompanying drawings.

Figure 1:
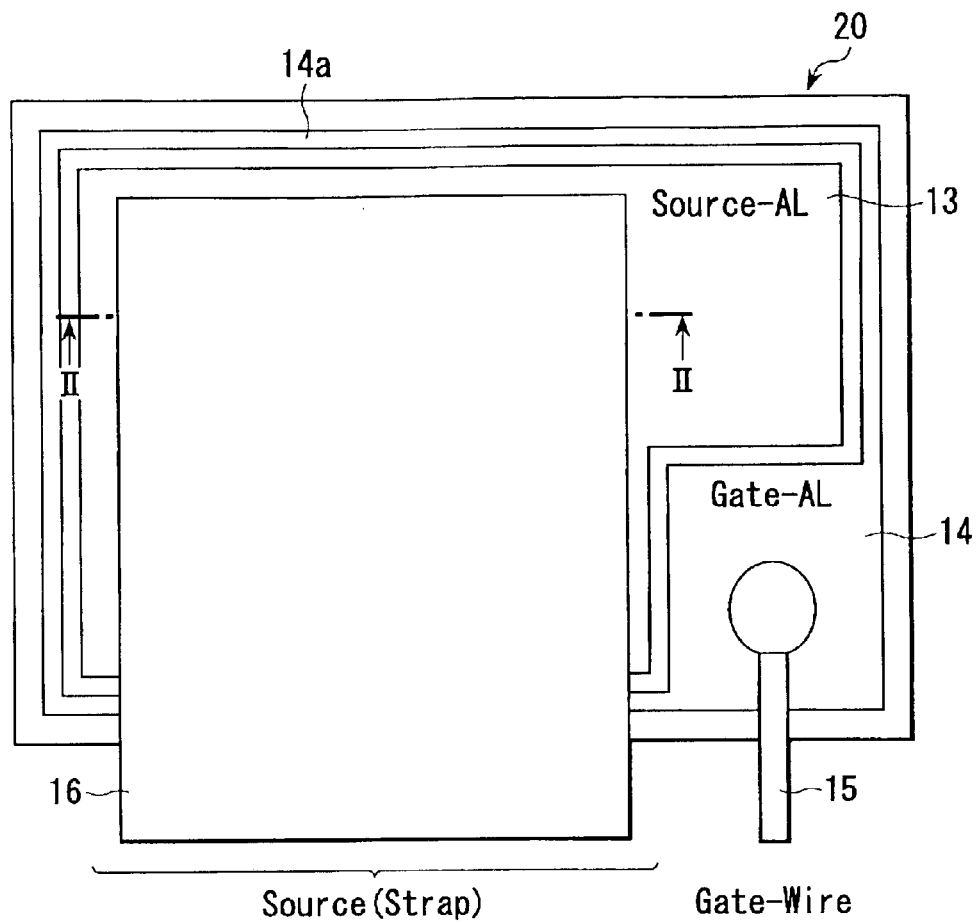
FIG. 1 is a plan view schematically showing a portion of a trench gate type power NMOSFET using a strap member according to the first embodiment.
Figure 2:
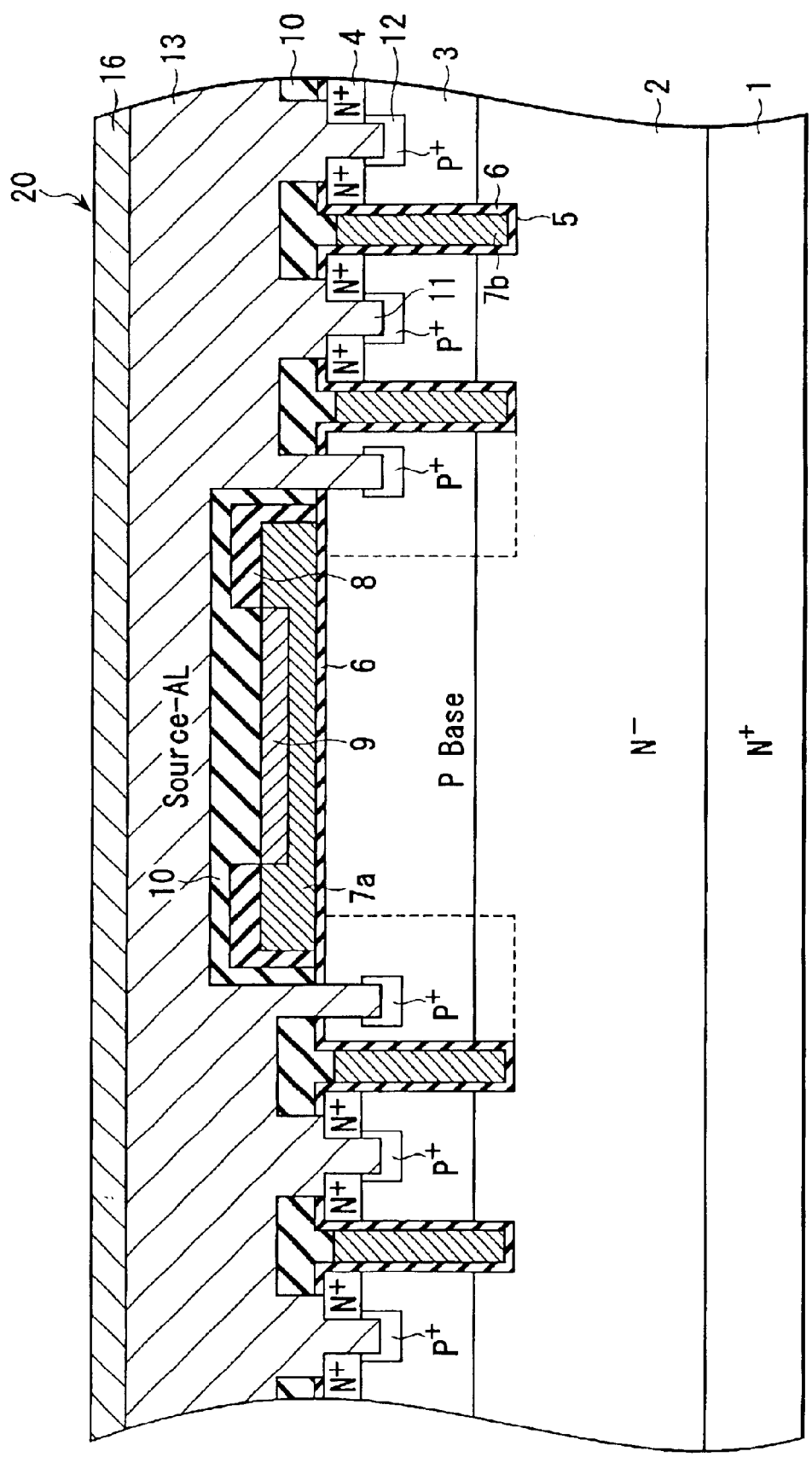
FIG. 2 is a sectional view schematically showing a structure taken along a line II—II in FIG. 1.

FIG. 1 is a plan view schematically showing a portion of a trench gate type power N(-channel) MOSFET using a strap member according to the first embodiment. FIG. 2 is a sectional view schematically showing a structure taken along a line II—II in FIG. 1.

Figure 3:
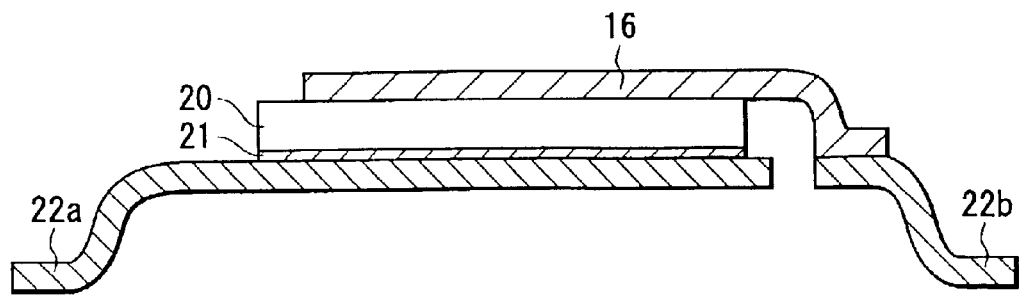
FIG. 3 is a sectional view schematically showing a semiconductor chip mounted on a lead frame.

In this power MOSFET shown in FIGS. 1 and 2, a semiconductor chip 20, which includes a MOSFET having a surface source electrode 13 connected to source diffusion layers 4 and a surface gate electrode 14 connected to a gate polysilicon wiring layer 7a, is mounted on a lead frame as shown in FIG. 3.

A wire (Gate-Wire) 15 is connected by bonding so as to electrically connect the surface gate electrode 14 to a lead portion of the lead frame.

In addition, to electrically connect the surface source electrode 13 to the lead frame, a Cu or Al strap member 16 is connected onto the surface source electrode 13 by US.

In the semiconductor chip 20, reference numeral 1 denotes an N$^+$-type silicon substrate; 2, an N-type epitaxial layer formed on one major surface of the N$^+$-type silicon substrate 1; 3, a P-type base region formed on the surface of the epitaxial layer 2; 4, the N$^+$-type source regions selectively formed on the surface of the P-type base region 3; 5, gate trenches extending from the surface of the P-type base region 3 to the epitaxial layer 2 through portions of the N$^+$-type source regions 4; and 6, a gate oxide film (silicon oxide film) formed on the surfaces of the N$^+$-type source regions 4 and on the inner surfaces of the gate trenches 5.

Reference numeral 7a denotes the gate polysilicon wiring layer formed by patterning a heavily doped polysilicon film deposited on the silicon oxide film 6; and 7b, trench gates which are formed by burying the polysilicon film in the gate trenches 5 and connect to the gate polysilicon wiring layer 7a.

Reference numeral 8 denotes an insulating film which covers the surface such that the upper surface of the gate polysilicon wiring layer 7a is partially exposed; and 9, a Ti/TiN silicide layer, for example, formed on the exposed portion of the upper surface of the gate polysilicon wiring layer 7a.

Reference numeral 10 denotes an interlayer dielectric film which covers the gate polysilicon wiring layer 7a and Ti/TiN silicide layer 9; 11, contact holes selectively formed to reach the P-type base region 3 through the interlayer dielectric film 10, the underlying silicon oxide film 6, and the N$^+$-type source regions 4; and 12, a diffusion layer formed on the bottom and its vicinity of each contact hole 11 to obtain an ohmic contact with the N$^+$-type source regions 4. In addition, a contact hole (not shown) is formed in the interlayer dielectric film 10 on the silicide layer 9 on the gate polysilicon wiring layer 7a in a chip peripheral portion.

Reference numerals 13, 14, and 14a denote metal layers (e.g., Al layers) deposited by sputtering and patterned on the interlayer dielectric film 10. More specifically, reference numeral 13 denotes the surface source electrode connecting to the N$^+$-type source regions 4 through the contact holes 11; 14a, a wiring layer in contact with the silicide layer 9 on the upper surface of the gate polysilicon wiring layer 7a through the contact hole (not shown) in the chip peripheral portion; and 14, the surface gate electrode (pad) connecting to the wiring layer 14a. On the other major surface (rear surface) of the N$^+$-type silicon substrate 1, a drain electrode (not shown) which is a metal layer (e.g., an Al layer) is formed.

An example of a fabrication method of the MOSFET device comprised of the semiconductor chip 20 shown in FIGS. 1 and 2 will be explained below.

On the major surface of the semiconductor substrate 1 made of N$^+$-type silicon, the N-type epitaxial layer 2 is formed by epitaxial growth. Then, using ion implantation, a P-type impurity, e.g., boron, is implanted into the surface of the epitaxial layer 2 and then diffused thereinto to provide the P-type base region 3.

Subsequently, an N-type impurity, e.g., arsenic, is selectively implanted into the P-type base region 3, thereby forming source regions 4 therein.

Thereafter, gate trenches 5 are selectively formed by, e.g., reactive ion etching (RIE) so as to extend from the surface of the P-type base region 3 to the epitaxial layer 2 through portions of the N$^+$-type layers 4.

The substrate surface is then oxidized to form the gate oxide film (gate oxide film) 6.

Thereafter, a polysilicon film for the gate electrode, which is heavily doped with the N-type impurity, is deposited until the gate trenches 5 are completely filled. This polysilicon film is selectively etched to the silicon surface except for a gate wiring portion, thereby forming a gate polysilicon wiring layer 7a and trench gates 7b.

An insulating film 8 is deposited on the substrate surface by CVD and patterned to expose a portion of the gate polysilicon wiring layer 7a. Ti/TiN, for example, is deposited on the exposed wiring layer 7a by sputtering, and rapid thermal annealing (RTA) is performed to form a silicide layer 9 therein.

Thereafter, the interlayer dielectric film 10 is deposited by CVD, and contact holes 11 for the contact with the source regions 4 are formed by RIE. A P-type impurity, e.g., boron, is implanted and diffused in the contact holes 11 to form a diffusion layer 12 for obtaining an ohmic contact with each of the source regions 4.

A metal for forming the surface source electrode 13, the surface gate electrode 14 and the wiring layer 14a is deposited by sputtering. Finally, the drain electrode is provided on the opposite surface of the substrate 1 to obtain the trench gate type power NMOSFET as described above.

The reliability of the strap member of the trench gate type power NMOSFET according to the above embodiment can be improved by connecting the strap member 16 onto the surface source electrode 13 by US.

Figure 5:
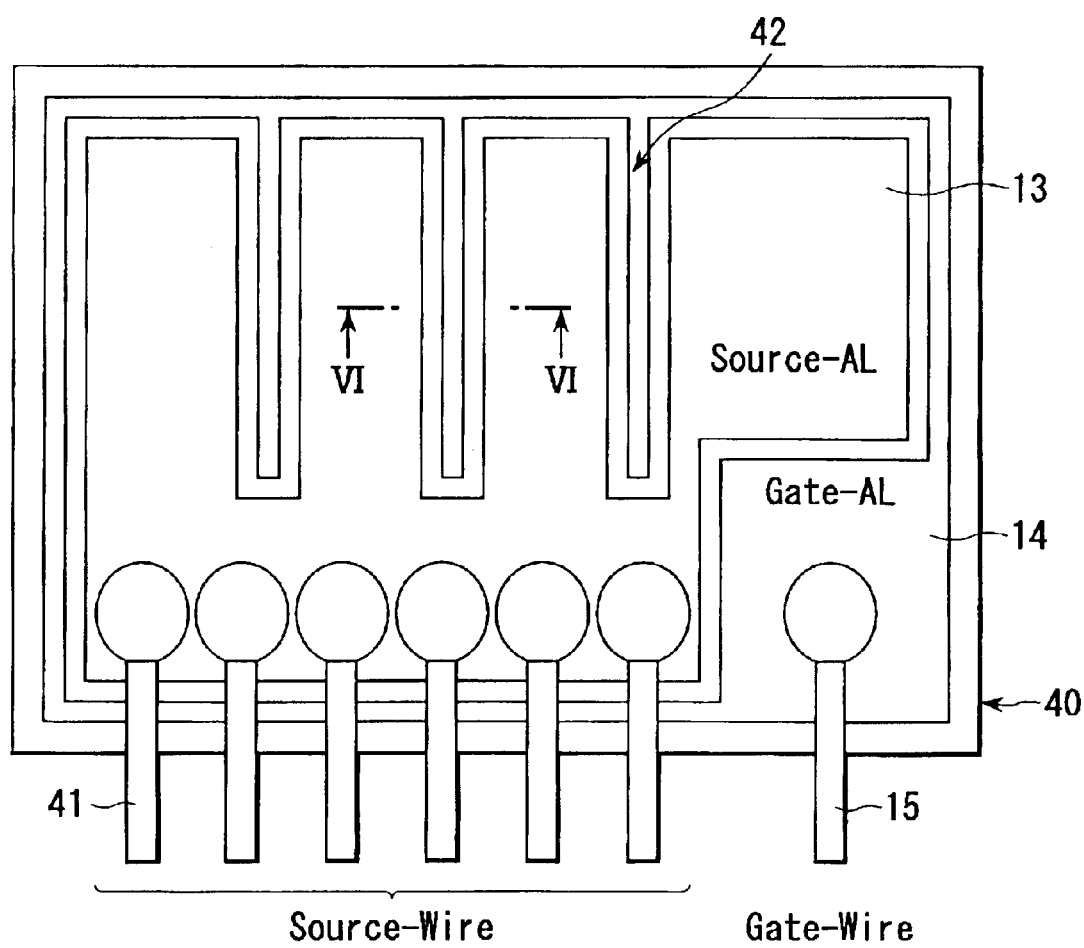
FIG. 5 is a plan view schematically showing a portion of a trench gate type power MOSFET using a conventional wire bonding structure.
Figure 6:
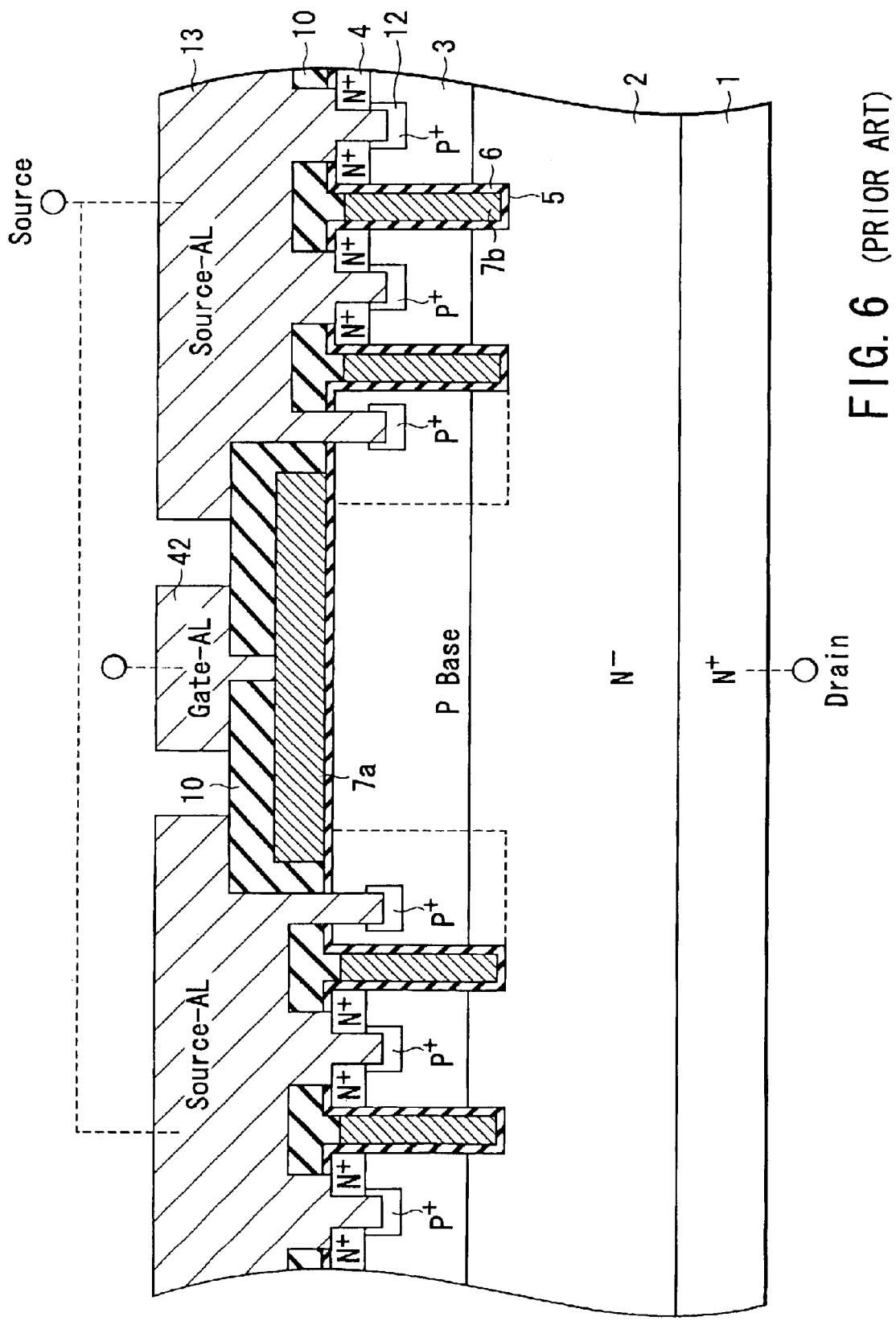
FIG. 6 is a sectional view schematically showing a structure taken along a line VI—VI in FIG. 5.
Figure 7:
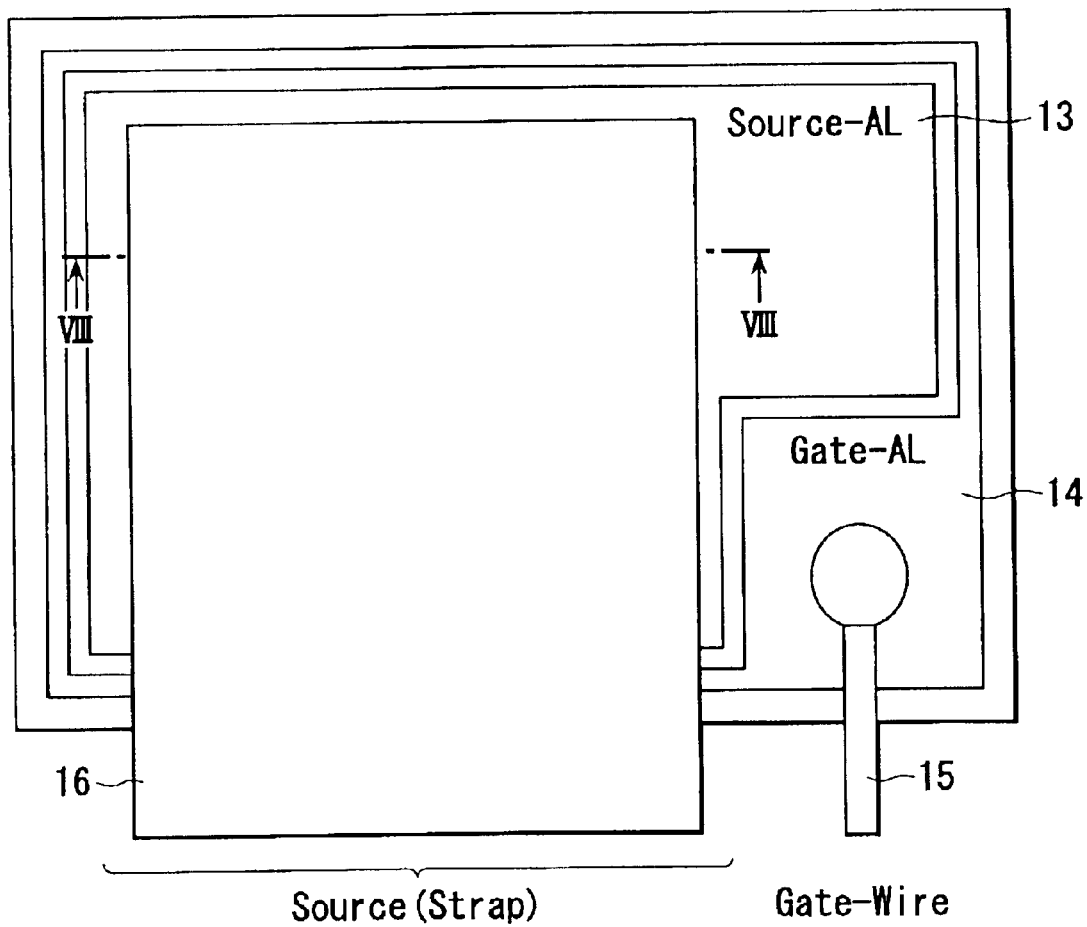
FIG. 7 is a plan view schematically showing a portion of a power MOSFET using a conventionally proposed strap member structure.
Figure 8:
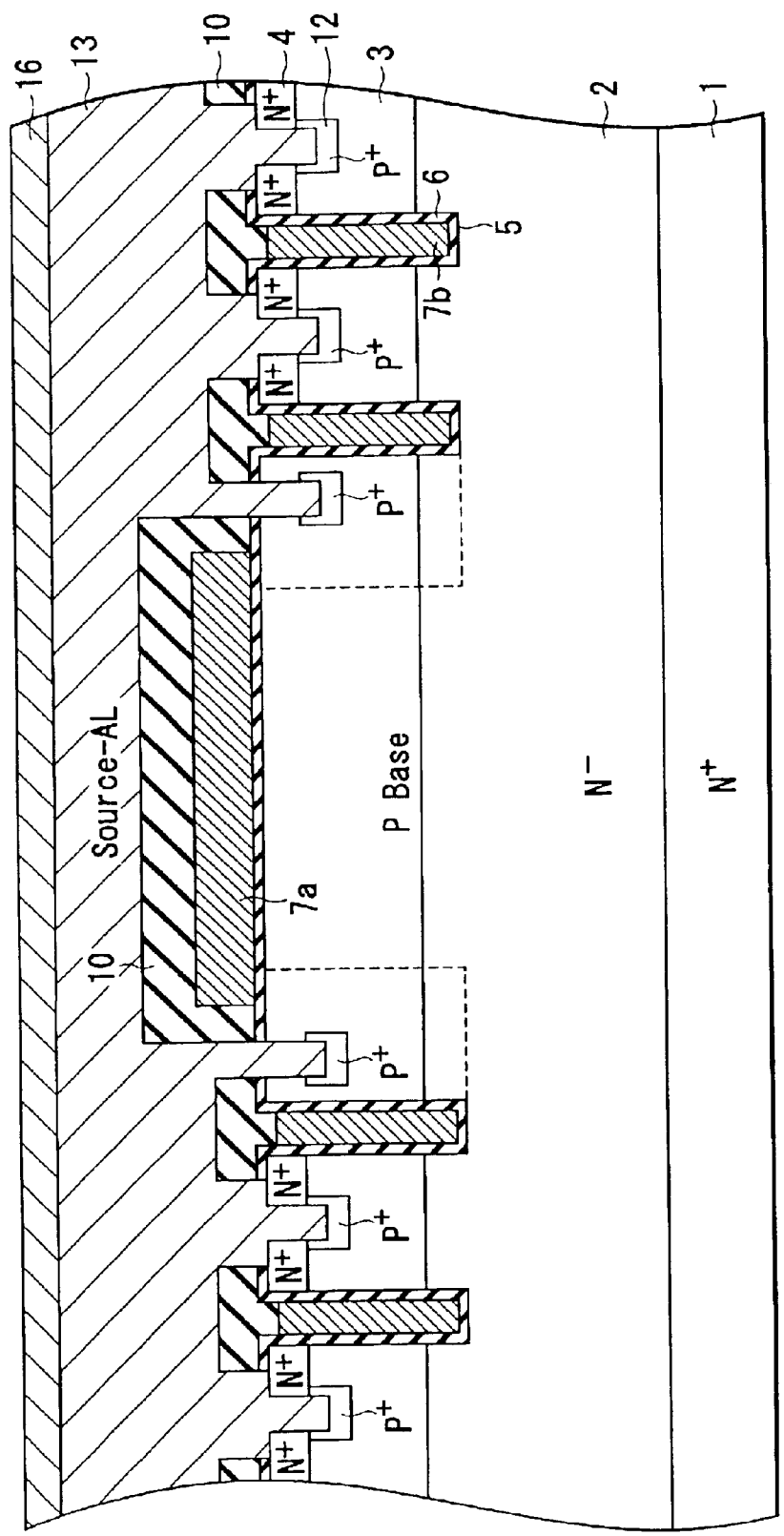
FIG. 8 is a sectional view schematically showing a structure taken along a line VIII–VII in FIG. 7.

Also, the silicide layer 9 is formed by silicidation in a portion of the upper surface of the gate polysilicon wiring layer 7a, and the surface gate electrode 14 is connected via the wiring layer 14a in contact with the silicide layer 9. This realizes a low internal resistance rg (about 1.5Ω) similar to that in the case where the gate Al wiring layer (42 in FIG. 5) is provided. Accordingly, the gate Al wiring layer (42 in FIG. 5) used in the prior art can be omitted.

Consequently, a trench gate type power NMOSFET having a low ON resistance can be implemented although a strap member is used.

FIG. 3 shows a state in which the power NMOSFET chip 20 is mounted on a lead frame 22 via a conductive coupling layer 21. That is, the drain electrode of the MOSFET is coupled with a lead portion 22a of the lead frame 22, and the strap member 16 connected to the surface source electrode 5 is coupled with a lead portion 22b. Likewise, the gate wire 15 is also connected to a lead portion (not shown).

Figure 4:
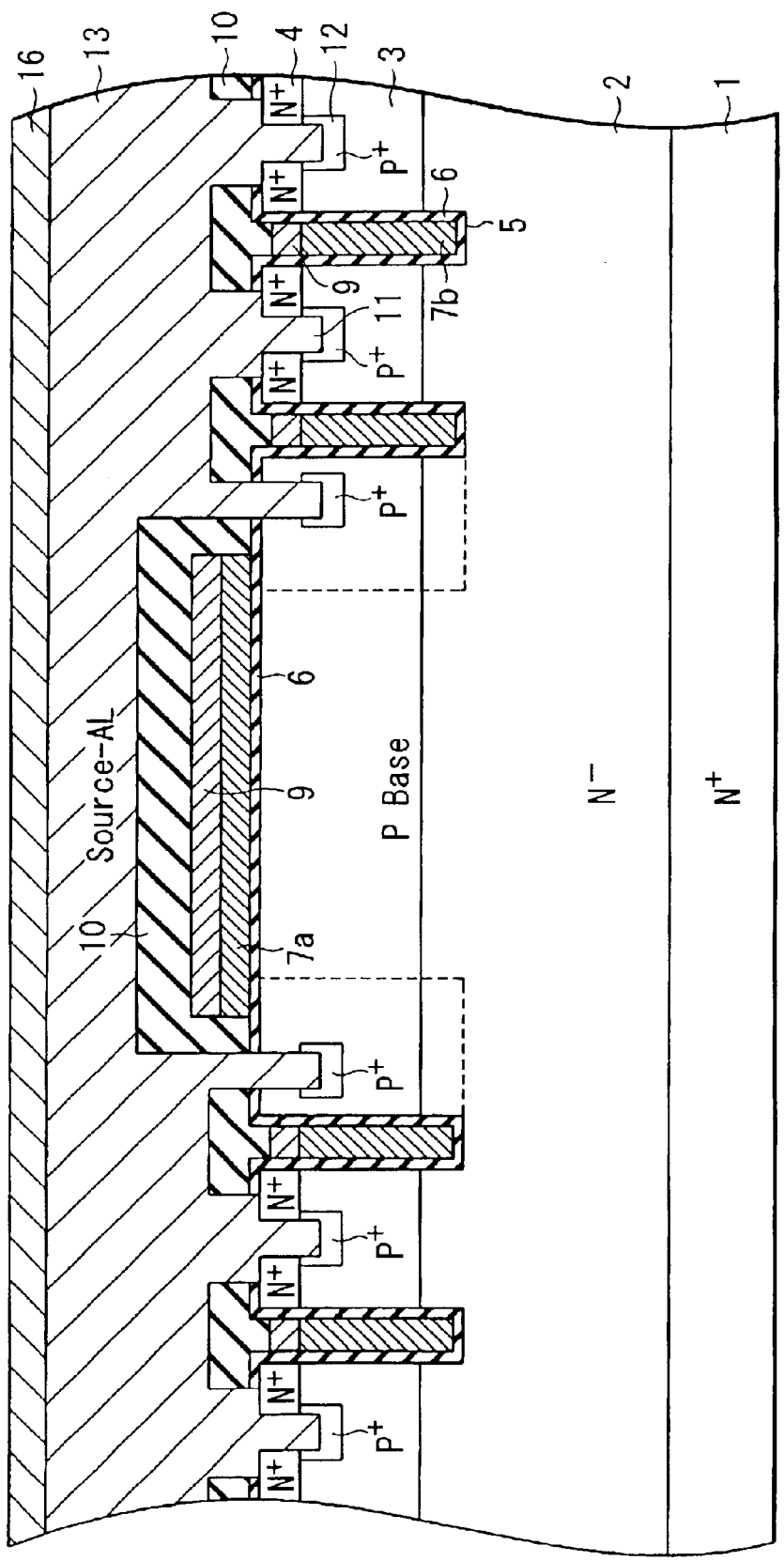
FIG. 4 is a sectional view schematically showing a portion of a trench gate type power NMOSFET using a strap member according to the second embodiment.

FIG. 4 is a sectional view schematically showing a portion of a trench gate type NMOSFET using a strap member according to the second embodiment.

This power NMOSFET of the second embodiment has the same planar pattern as the power NMOSFET of the first embodiment described above. However, the sectional structure and formation steps of a gate polysilicon wiring layer are different as will be described below. Since the rest is the same, the same reference numerals as in FIG. 2 denote the same parts in FIG. 4.

That is, the polysilicon film for the gate electrode, which is heavily doped with the N-type impurity, is deposited until gate trenches 5 are completely filled, and this polysilicon film is selectively etched to the silicon surface except for the gate wiring layer portion, thereby forming the gate polysilicon wiring layer 7a and trench gates 7b. These processes are the same as in the first embodiment. Thereafter, Ti/TiN, for example, is deposited by sputtering without depositing any insulating film 8 on the substrate surface, and subjected to RTA to form the silicide layer 9. At the same time, the upper portion of the polysilicon layer in each trench gate 7b is subjected to the silicidation to form the silicide layer 9. The interlayer dielectric film 10 is then formed.

In the second embodiment described above, the insulating film 8 which covers the upper surface of the gate polysilicon wiring layer 7a partially exposed is omitted, and the Ti/TiN silicide layer 9 is formed on both the entire upper surface of the gate polysilicon wiring layer 7a and the polysilicon surface of each trench gate 7b.

This structure has the same advantages as the power NMOSFET of the first embodiment described previously.

Note that although each of the above embodiments takes a trench gate type power NMOSFET as an example, the present invention is of course also applicable to a trench gate type power PMOSFET or an IGBT in accordance with the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a semiconductor substrate having first and second surface opposing each other, the substrate including a plurality of cells sharing a common drain region;
   a surface source electrode connected to a source region of each of the cells and provided on the first surface;
   a plurality of trench gates, provided in the substrate, each having a buried polysilicon layer and further having a silicide layer thereon;
   a gate polysilicon wiring layer connecting the trench gates to one another and having a silicide layer thereon;
   a surface gate electrode connected to the gate polysilicon wiring layer and provided on the first surface;
   a strap member coupled to the surface electrode by ultrasonic waves; and
   a drain electrode, provided on the second surface, being common to the cells.

2. The device according to claim 1, wherein the gate polysilicon wiring layer is covered with an interlayer dielectric film.

3. The device according to claim 1, wherein the semiconductor substrate is mounted on a lead frame.

4. The device according to claim 1, wherein the surface source electrode is mainly composed of aluminum (Al).

5. The device according to claim 1, wherein the strap member is mainly composed of a material selected from the group consisting of copper (Cu) and aluminum (Al).

6. The device according to claim 1, wherein the cells are selected from a MOSFET and an IGBT.

7. A semiconductor device comprising:
   a semiconductor substrate having first and second surface opposing each other, the substrate including a plurality of cells each having a first electrode region, the cells sharing a common second electrode region;
   a first main electrode connected to the first electrode region of each of the cells and provided on the first surface;
   a plurality of trench gates, provided in the substrate, each having a buried polysilicon layer and further having a silicide layer thereon;
   a gate polysilicon wiring layer connecting the trench gates to one another and having a suicide layer thereon;
   a surface gate electrode connected to the gate polysilicon wiring layer and provided on the first surface;
   a strap member coupled to the first main electrode by ultrasonic waves; and
   a second main electrode, provided on the second surface, being common to the cells.

8. The device according to claim 7, wherein the gate polysilicon wiring layer is covered with an interlayer dielectric film.

9. The device according to claim 7, wherein the semiconductor substrate is mounted on a lead frame.

10. The device according to claim 7, wherein the first main electrode is mainly composed of aluminum (Al).

11. The device according to claim 7, wherein the strap member is mainly composed of a material selected from the group consisting of copper (Cu) and aluminum (Al).

12. The device according to claim 7, wherein the cells are selected from a MOSFET and an IGBT.

* * * * *